United States Patent
Arai et al.

(10) Patent No.: US 8,153,966 B2
(45) Date of Patent: Apr. 10, 2012

(54) ELECTRODE UNIT AND CHARGED PARTICLE BEAM DEVICE

(75) Inventors: Noriaki Arai, Hitachinaka (JP); Hideyuki Kazumi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/992,788

(22) PCT Filed: May 15, 2009

(86) PCT No.: PCT/JP2009/059048
§ 371 (c)(1),
(2), (4) Date: Nov. 15, 2010

(87) PCT Pub. No.: WO2009/139461
PCT Pub. Date: Nov. 19, 2009

(65) Prior Publication Data
US 2011/0068265 A1    Mar. 24, 2011

(30) Foreign Application Priority Data
May 16, 2008   (JP) .................................. 2008-129726

(51) Int. Cl.
*H01J 37/244*    (2006.01)
(52) U.S. Cl. .................... 250/306; 250/310; 250/251
(58) Field of Classification Search .................. 250/306, 250/310, 251
See application file for complete search history.

(56) References Cited

U.S. PATENT DOCUMENTS

| | | | |
|---|---|---|---|
| 6,172,363 B1 | 1/2001 | Shinada et al. | |
| 6,476,387 B1 | 11/2002 | Nishimura et al. | |
| 6,504,393 B1 | 1/2003 | Lo et al. | |
| 6,555,815 B2 | 4/2003 | Feuerbaum et al. | |
| 6,979,822 B1 * | 12/2005 | Stewart et al. | 250/310 |
| 7,459,681 B2 | 12/2008 | Arai et al. | |
| 2004/0026633 A1 | 2/2004 | Gunji et al. | |
| 2007/0085005 A1 | 4/2007 | Hasegawa et al. | |

FOREIGN PATENT DOCUMENTS

| | | |
|---|---|---|
| JP | 59-155941 | 9/1984 |
| JP | 06-338282 | 12/1994 |
| JP | 07-153410 | 6/1995 |

(Continued)

*Primary Examiner* — Kiet T Nguyen
(74) *Attorney, Agent, or Firm* — McDermott Will & Emery LLP

(57) ABSTRACT

A high-resolution sample image is acquired by eliminating both of charge over an entire sample (global charge) and charge in a local region irradiated with a primary charged particle beam (local charge). An electrode unit (50) according to the present invention is used in a charged particle beam device. The electrode unit (50) includes a plate electrode disposed facing an insulator sample between an objective lens and the sample, and further includes: a first charge-neutralization charged particle beam source which emits a first charged particle beam to eliminate local charge on the sample; and a second charge-neutralization charged particle beam source (25) which emits a second charged particle beam to eliminate global charge on the sample. A first hole (53) through which a primary charged particle beam passes, and a second hole through which the second charged particle beam is emitted are provided in the plate electrode, and the first and second charge-neutralization charged particle beam sources are disposed at such positions as not to interfere with each other. The charged particle beam emitted from the first charge-neutralization charged particle beam source is introduced in the vicinity of the first hole (53).

17 Claims, 9 Drawing Sheets

FOREIGN PATENT DOCUMENTS

| | | |
|---|---|---|
| JP | 10-294345 | 11/1998 |
| JP | 11-121561 | 4/1999 |
| JP | 2000-036273 | 2/2000 |
| JP | 3343421 | 8/2002 |
| JP | 2004-031379 | 1/2004 |
| JP | 2005-174591 | 6/2005 |
| JP | 2006-054094 | 2/2006 |
| JP | 2006-351303 | 12/2006 |
| JP | 2007-149449 | 6/2007 |
| JP | 2007-280614 | 10/2007 |

* cited by examiner (a)

(b)

(a)

(b)

(a)

(b)

(a)

(b)

(c)

ELECTRODE UNIT AND CHARGED PARTICLE BEAM DEVICE

RELATED APPLICATIONS

This application is the U.S. National Phase under 35 U.S.C. §371 of International Application No. PCT/JP2009/059048, filed on May 15, 2009, which in turn claims the benefit of Japanese Application No. 2008-129726, filed on May 16, 2008, the disclosures of which Applications are incorporated by reference herein.

1. Technical Field

The present invention relates to an electrode unit including a plate electrode disposed facing an insulator sample between an objective lens and the sample, and a charged particle beam device having the electrode unit and used for observing the sample by irradiating the sample with a charged particle beam.

2. Background Art

Photomasks are a typical insulator to be observed in a charged particle beam device, such as an SEM, a focused ion beam (FIB) device, or a device combining the SEM and the FIB, which uses charged particles (electrons or ions) secondarily emitted from the insulator surface as a signal to visualize or identify the structure or material of the sample surface.

In a photomask, a laminated film of chromium, molybdenum and silicon, as typical conductors, is generally patterned on a glass substrate having a thickness of about 6 mm to block, reflect or transmit light. When the photomask as a sample is irradiated with a charged particle beam, for example, with an electron beam to observe or measure the dimension of a pattern shape by using the SEM, charges may be unevenly distributed on the sample, or an electric potential thereof may rise to cause a change between positive and negative polarities over the entire sample due to different secondary electron generation efficiencies of the patterned portion as a conductor and the glass portion as an insulator, and accumulation of charges on the insulator.

In semiconductor wafers, an integrated circuit with a multilayer structure is formed on a silicon substrate. In a case where a region irradiated with the charged particle beam has an insulating film, or a structure including an insulator, uneven distribution or accumulation of charges occurs as in the photomask to a greater or lesser extent.

As a result, a potential gradient occurs inside or inside and outside the region irradiated with the electron beam on the sample surface, and drift of an SEM image occurs with the electron beam being deflected by the action of an electric field. Moreover, the electric potential of the sample is unstable, and is thus difficult to estimate, so that the electron beam related to an SEM magnification cannot be appropriately controlled. Thus, it is necessary to eliminate or stabilize charge in a device such as a critical dimension SEM where accurate and stable reproducibility is required.

As a typical conventional technique, a physical interaction between charged particles and a sample surface such as the energy or irradiation amount of a charged particle beam (a primary charged particle beam) emitted onto a sample, or the raster scan rate thereof on the sample, that is, the controllable values of the charged particle beam which can be employed as parameters for relaxing charge, such as the secondary electron generation efficiency of the sample, the penetration depth of charged particles into the sample, the giving and receiving of energy therebetween, and the mobility of charges, are set such that the charge becomes smaller.

The irradiation energy of the charged particle beam is often set to a low energy of several hundred eV such that an insulator is positively charged. The irradiation energy is set to a low energy because there is an advantage that charges are not excessively accumulated when the positive charge condition is employed in a system such as a charged particle beam device where charged particles are incident on a sample and charged particles are emitted from the sample.

The technique of controlling positive charge utilizes self charge convergence based on the irradiation condition of the charged particle beam and the formation control of a potential saddle point accompanying a potential rise in a charged portion. For example, Patent Documents 1 to 3 disclose the control technique.

Meanwhile, a method of neutralizing electrification charges induced by irradiation with a charged particle beam by using charges having an opposite polarity to the electrification charges is also employed. For example, Patent Document 4 discloses to use positive or negative ions generated by an ion generator which generates ions by gas discharge or irradiation of a gas with ultraviolet light in a sample chamber of a charged particle beam device in a vacuum atmosphere.

Also, for example, Patent Documents 5 and 6 disclose a method of neutralizing positive charge by photoelectrons generated by irradiating a member in the vicinity of a sample with ultraviolet light, and a method of neutralizing charge by irradiating a sample surface directly with ultraviolet light to ionize a gas absorbed on the sample surface, or excite electrons on the sample surface to make the surface conductive.

As the charged particle beam device, a so-called ESEM (Environmental SEM) or a so-called LVSEM (Low Vacuum SEM) capable of emitting a charged particle beam while maintaining a sample chamber under a low vacuum of several pascals (Pa) to several thousand pascals (Pa) by improving differential exhaust of a charged particle irradiation optical system has been put to practical use.

In the ESEM or the LVSEM, a residual or introduced gas in the sample chamber is ionized by colliding with an irradiating electron beam or secondary electrons generated from a sample, and ions and electrons thereby produced contribute to positive or negative charge neutralization, or introduced or residual water prevents an insulator from being charged, so that observation is enabled.

In the ESEM or the LVSEM, however, there is a problem that resolution is reduced since the primary charged particle beam travels a long distance in the low vacuum, and collides with the gas to be scattered and spread. There is also a problem that discharge occurs in the low vacuum in a charged particle detector which operates in a high vacuum.

To solve the problems, for example, Patent Document 7 discloses a method for avoiding a large decrease in pressure of an entire sample chamber by introducing a gas and thereby forming a gas layer only on a sample surface.

Patent Document 1:
JP Patent Publication (Kokai) No. 59-155941A (1984)
Patent Document 2:
JP Patent No. 3343421
Patent Document 3:
JP Patent Publication (Kokai) No. 2006-54094A
Patent Document 4:
JP Patent Publication (Kokai) No. 2007-149449A
Patent Document 5:
JP Patent Publication (Kokai) No. 2005-174591A
Patent Document 6:
JP Patent Publication (Kokai) No. 2000-36273A
Patent Document 7:

U.S. Pat. No. 6,555,815

DISCLOSURE OF THE INVENTION

Problems to be Solved by the Invention

In both the photomask and the semiconductor wafer, patterning is performed by applying a resist as a photosensitive material on the surface in the manufacturing process. Since the resist is an insulator made of an organic material, charge occurs when the photomask or the semiconductor wafer is used as the sample in the charged particle beam device.

When the resist is applied on an insulator, charge generally becomes more prominent. In the SEM, image recognition becomes difficult due to abnormal contrast or larger drift occurs. Thus, length measurement cannot be stably performed.

Conventionally, when the resist is observed with the SEM, the secondary electron generation efficiency is set to 1 by reducing the irradiation energy of the electron beam to about 0.5 keV. That is, secondary electrons of the same number as that of incident electrons are generated, or an effective charge balance between the incident electrons and the secondary electrons is set to 1:1 by causing the generated secondary electrons to partially travel on a orbit to return to the sample by the action of a magnetic or electric field and be re-absorbed into the sample. The charge is thereby suppressed.

However, when the irradiation energy of the electron beam is reduced in the normal SEM, chromatic aberration increases, and the probe diameter of the electron beam is blurred and become larger. Thus, there occurs a problem that resolution and SN are reduced. Also, along with a decrease in pattern size, the development accuracy of the resist is becoming more important. The resist shape and dimension accuracy need to be controlled with high resolution.

Meanwhile, since the resist is photosensitive, the conventional method for eliminating charge by ultraviolet light irradiation cannot be applied.

Thus, it is necessary to acquire a stable and high-resolution image with no abnormal contrast, and a signal used for shape or dimension measurement, for example, the secondary electrons or reflected electrons, with good reproducibility by eliminating the charge in the resist.

The accumulation or distribution of charges to be recognized as the charge depends on the pattern shape or structure of an insulator within a local region irradiated with the charged particle beam or in the vicinity thereof. For example, in a case where a resist photomask having a pattern where a resist on chromium forms a line and glass forms a space is scanned and irradiated with the electron beam by using the SEM, the irradiating electron beam may cause charges to be accumulated in the resist and glass, the secondary electrons generated from the glass or the electrons reflected therefrom may adhere to the resist side surface, or more secondary electrons may be generated. Accordingly, charge transfer and a local potential change occur continuously. Also, the charges on the glass or resist surface are not quickly diffused, and the electric potential remains unstable to keep changing over a long period. If the pattern is complicated like a maze, the charges cannot be diffused isotropically. Thus, a charge density becomes uneven, and unstable abnormal contrast and beam drift are further encouraged.

To stably acquire an image of the sample, both of charge over the entire sample (global charge) and charge in a local region irradiated with the primary charged particle beam (local charge) need to be eliminated.

The present invention has been made in view of such circumstances, and achieves higher resolution and stable acquisition of a sample image in a charged particle beam device.

Means for Solving the Problems (1) To attain the above object, in the present invention, a charged particle beam having a higher irradiation energy than that in a conventional case is used. For example, when the irradiation energy is increased to 1 keV to 2 keV from a conventional value of 100 eV, chromatic aberration can be dramatically improved, and less damage is caused to an irradiated portion.

However, when the irradiation energy is increased, second electron generation efficiency becomes less than 1. An insulator is thereby negatively charged, so that a conventional section which controls positive charge cannot be employed. Thus, a section which controls negative charge by converting the negative charge into positive charge or a neutralized state can be employed. To be more specific, it is considered effective to combine an addition element capable of converting the negative charge into the positive charge with an electrode which effectively relaxes charge on a photomask as disclosed in Patent Document 3.

An advantage as described below is obtained by reducing a WD (Working Distance) that is a distance between a sample and a lens focusing the charged particle beam as another technique for obtaining higher resolution. By reducing a focal length, a chromatic aberration coefficient and a spherical aberration coefficient can be reduced, and an optical reduction rate can be increased (an optical magnification can be reduced). Thus, the projection size of the light source diameter of a charged particle beam source onto the sample and noise influence can be reduced.

An objective lens of an SEM employs an electromagnetic lens which immerses the sample in a magnetic field to more effectively achieve the above advantages, that is, a so-called in-lens or semi-in-lens. The focal length can be thereby reduced. Secondary electrons generated from the sample move on a spiral path in the magnetic field on the sample immediately after being emitted, which is convenient as the means for solving the problems in the present invention.

(2) Also, to attain the above object, the present invention has a configuration to eliminate both of charge over the entire sample (global charge) and charge in a local region (local charge). When the insulator is irradiated with charged particles, redundant positive or negative charges are accumulated according to the dielectric constant of the sample due to a balance between charges incident on the sample and secondary electrons generated therefrom since the insulator is not conductive. A temporal potential change is also caused. The potential change need to be distinguished between a potential rise over the entire dielectric body and a potential rise at the level of the region irradiated with the charged particle beam (several ten μm to several hundred nm) (in the following, the former is called global charge, and the latter is called local charge). When the sample is irradiated with the charged particle beam, the global charge and the local charge develop at the same time. The global charge is charge over the entire sample or in a region much larger than that of the local charge. If the sample is simply irradiated with charged particles having an opposite polarity to the induced charge, that is, neutralization ions or electrons as in the conventional technique, the charged particles for the global charge are much less sensitive to the electric field of the local charge. This is because the electric field of the global charge is larger than the electric field formed by the local charge. Thus, most of the neutralization charged particles act to neutralize the global charge and maintain a neutralized state.

It is thereby understood that the neutralization charged particles need to be effectively applied to a local region irradiated with a primary charged particle beam that is emitted onto the sample to neutralize the local charge. To solve the problem, a neutralization charged particle source having an optical axis directed to a point at which the optical axis of the primary charged particle beam crosses the sample can be used to emit the neutralization charged particles.

The neutralization charged particle source may generate ions or electrons by using gas discharge or gas ionization by impact of electrons emitted from a filament. The neutralization charged particle source having a compact structure so as to be easily incorporated into a charged particle beam device can be thereby achieved.

However, when the sample is irradiated with the neutralization charged particles of high energy, the charged particles collide with the sample to generate secondary electrons. Accordingly, positive and negative charges may be off balance, or the sample may be charged by excessive charged particles having the same polarity as the charges of the neutralization charged particles.

To avoid the excessive charge, the neutralization charged particle beam may be prevented from being electrically accelerated with respect to the sample, or a potential difference between the sample and the charged particle beam source may be set to several volts to several ten volts. Obviously, the neutralization charged particle source is preferably mounted close to the optical axis of the primary charged particle beam.

To obtain higher resolution, the neutralization charged particle source is combined with the electrode disposed facing the sample as a single unit, and the electrode is set to the same potential as a sample holder. Accordingly, there exists a non-electric field between the sample and the electrode. The neutralization charged particles leaking from the neutralization charged particle source can be emitted onto the local charge in a low energy state. The electrode unit preferably has a size large enough to cover the entire moving range of the sample such that the sample does not project from the electrode unit in order to maintain constant electrostatic capacity in the sample, particularly a photomask, as the dielectric body.

Even when a small potential difference is applied between the sample and the electrode to cause the neutralization charged particles to be more effectively incident on the sample, secondary electron generation by the collision of the charged particles of low energy, particularly, ions is small enough to be disregarded. Thus, a balance between electrification charges and the charges of the neutralization charged particles does not change. Even when excessive neutralization charged particles adhere to the sample to act to convert the negative charge into positive charge, the positive charge does not develop because of the electrode effect, and the charge converges by itself.

Also, when the energy of the irradiating neutralization charged particles is small, the charged particles are repelled and cannot reach the charge having the same polarity as the charges of the charged particles. Thus, the charge can be prevented from developing excessively. The effect applies to both the local charge and the global charge.

The aforementioned neutralization charged particle source is effectively used for the global charge as well as the local charge. However, in reality, charge amounts respectively contributing to the local charge and the global charge are different depending on the primary charged particle beam and the secondarily generated charge amount. That is, the region irradiated with the primary charged particle beam is subject to the influences of secondary electron generation efficiency and pattern shape. Thus, the local charge and the global charge have difference charge densities from each other.

Thus, it is difficult to neutralize the local charge and the global charge by simultaneously balancing the charges by a single neutralization charged particle source. It is preferable to separately provide a neutralization charged particle source for the local charge and a neutralization charged particle source for the global charge.

More preferably, the neutralization charged particle source is arranged directly above the position irradiated with the primary charged particle beam. In this case, a structure such as a plasma generation source as disclosed in the conventional art is physically difficult to arrange between the sample and the objective lens.

However, if a local low-vacuum region can be achieved directly above the sample, ions or electrons can be obtained by ionizing an introduced gas by the primary charged particle beam and the secondary electrons as in an LVSEM and an ESEM.

As an example of a section which achieves higher resolution and stable acquisition of a sample image by eliminating both the global charge and the local charge, a gas introduction path may be provided in the electrode, and a gas is caused to flow into a high-vacuum region from a primary charged particle beam passage hole provided in the center of the electrode. The passage hole has a small hole diameter such that a pressure in the vicinity thereof is locally reduced to a low vacuum level (several pascals (Pa) to several ten pascals (Pa)). Accordingly, a pressure in an entire sample chamber is not reduced a lot.

Due to the local low vacuum, scattering of the primary charged particle beam by gas molecules is small, and the resolution is hardly deteriorated. Moreover, since the pressure in the sample chamber decreases only slightly, an existing signal detection system can be directly used in a charged particle beam device which normally operates in a high vacuum.

Furthermore, according to the present invention, the electrode including the gas introduction path that enables a gas flow rate appropriate for increasing the local gas pressure can be set to a thickness of about 1 mm. The electrode can be thereby applied while keeping a short WD. When the electrode is arranged covering the sample, a gas density between the electrode and the sample is higher. Ionization efficiency is thereby improved. Also, when the semi-in-lens is used as the objective lens as described above, the ionization efficiency is further improved since the secondary electrons have a longer range.

(3) When the sample includes an insulator, a charge degree differs depending on the structure or the material configuration. Thus, it is necessary to set an optimum irradiation condition of the charged particle beam with respect to each sample in the conventional technique in which the irradiation condition of the charged particle beam is set such that the charge is smaller.

Thus, a configuration which does not require complicated setting of the irradiation condition and which is appropriate for automation, that is, which can eliminate the charge without depending on the sample, and a control method of automatically performing charge elimination need to be achieved.

To this end, a method of facilitating irradiation amount control of the neutralization charged particles and appropriately determining the necessity of irradiation is required. By using the section which eliminates both the global charge and the local charge as described above, the charge can be neutralized without inducing excessive charge. The charged particles emitted from the neutralization charged particle source consume charges corresponding to the charge amount.

When the number of emitted charged particles is smaller than the electrification charges, the charge cannot be neutralized. However, when the number of emitted charged particles is larger than the electrification charges, the charge can be quickly neutralized. The redundant charged particles collide with the electrode as a conductor and thereby disappear.

If there are much more neutralization charged particles than the electrification charges, discharge may occur. Thus, a collecting electrode which collects the redundant neutralization charged particles may be provided between the electrode and the sample. The collecting electrode acts similarly to an ion collector employed in an ionization vacuum gauge, and can be achieved by applying a bias of several bolts to several ten volts to the neutralization charged particle source.

Accordingly, the neutralization charged particle source may always generate redundant neutralization charged particles against the electrification charges. By correlating the amount of the neutralization charged particles with the irradiation amount of the primary charged particle beam that is a cause to induce the charge, simple control is enabled without depending on the sample.

In the present invention, when the primary charged particle beam has a low energy of about less than 1 keV, observation and measurement can be performed without using the neutralization charged particle source by assuming that positive charge occurs even when the sample is an insulator.

If a satisfactory result cannot be obtained due to insufficient resolution or an unstable signal by low SN under the condition, negative charge is induced by using the primary charged particle beam having an energy of 1 keV or more, and neutralized or converted into controllable positive charge by the neutralization charged particles. In a case where the negative charge is not actually induced even when the energy of the primary charged particle beam is increased, the neutralization charged particles do not need to be used. Thus, consumption of unnecessary electricity and introduced gas is suppressed. To this end, a function of automatically determining whether the neutralization charged particle source needs to be operated may be provided.

To determine the necessity of charge elimination, a prominent change in focal position of the primary charged particle beam can be automatically measured in the case of the global charge. For example, since the primary charged particle beam is decelerated to be overfocused due to a temporal development of the negative charge, an excitation change in the objective lens for focusing the primary charged particle beam on the sample can be automatically measured.

The local charge does not form an electric field large enough to largely change the focus of the primary charged particle beam. It is thus difficult to read a charge state from the focus change. However, when the negative charge is induced immediately after irradiation with the primary charged particle beam, more secondary electrons are detected due to the electron raising effect by a potential difference with a space above the sample and the disappearance of a potential saddle point. Accordingly, the local charge is determined from a signal amount, that is, an obvious increase in image brightness.

It is also possible to determine whether the neutralization charged particle source needs to be operated from the occurrence of beam drift due to an uneven electric field caused by the charge, or comparison with a template image acquired when the positive charge occurs.

(4) That is, the electrode unit according to the present invention is used for the charged particle beam device. The electrode unit includes a plate electrode disposed facing an insulator sample between an objective lens and the sample, and further includes a first charge-neutralization charged particle beam source which emits a first charged particle beam to eliminate local charge on the sample, and a second charge-neutralization charged particle beam source which emits a second charged particle beam to eliminate global charge on the sample. A first hole through which a primary charged particle beam passes, and a second hole through which the second charged particle beam is emitted are provided in the plate electrode. The first and second charge-neutralization charged particle beam sources are arranged at such positions as not to interfere with each other. The charged particle beam emitted from the first charge-neutralization charged particle beam source is introduced in the vicinity of the first hole. The first and second charge-neutralization charged particle beam sources are used with an inert gas being introduced therein.

A third hole through which the first charged particle beam is emitted diagonally relative to the plate electrode is provided in the plate electrode, and the primary charged particle beam passing through the first hole and the first charged particle beam emitted through the third hole cross each other in the vicinity of a position where the first charged particle beam is introduced on the sample.

The first hole has a smaller diameter on an incident side of the primary charged particle beam than a diameter on an emission side. The plate electrode may further include a cylindrical multistage orifice on the incident side of the primary charged particle beam.

The plate electrode has a size large enough to cover an entire moving range of the sample such that the sample does not project from the plate electrode.

The electrode unit may further include an ion collector in the vicinity of the first hole below the plate electrode.

The charged particle beam device according to the present invention includes the electrode unit as described above, and further includes a control section which controls operation of the first and second charge-neutralization charged particle beam sources. The control section operates at least one of the first and second charge-neutralization charged particle beam sources when irradiation energy of the primary charged particle beam source is higher than a prescribed value.

The control section determines whether or not to operate the second charge-neutralization charged particle beam source based on a temporal change in focus current value or focus voltage value of the objective lens, a temporal change in blur of a sample image, or a measurement result of a surface electrometer which measures a surface potential of the sample.

The control section determines whether or not to operate the first charge-neutralization charged particle beam source based on whether contrast of a sample image is reversed as compared to a reference image, information on the presence of an insulator at a position irradiated with the primary charged particle beam by using CAD data, brightness of a sample image, or a temporal displacement of a sample image.

Further features of the present invention will become apparent from the following description of the best mode for carrying out the invention and the accompanying drawings.

Advantage(s) of the Invention

According to the present invention, higher resolution and stable acquisition of a sample image can be achieved in the charged particle beam device.

DESCRIPTION OF SYMBOLS

Figure 1:
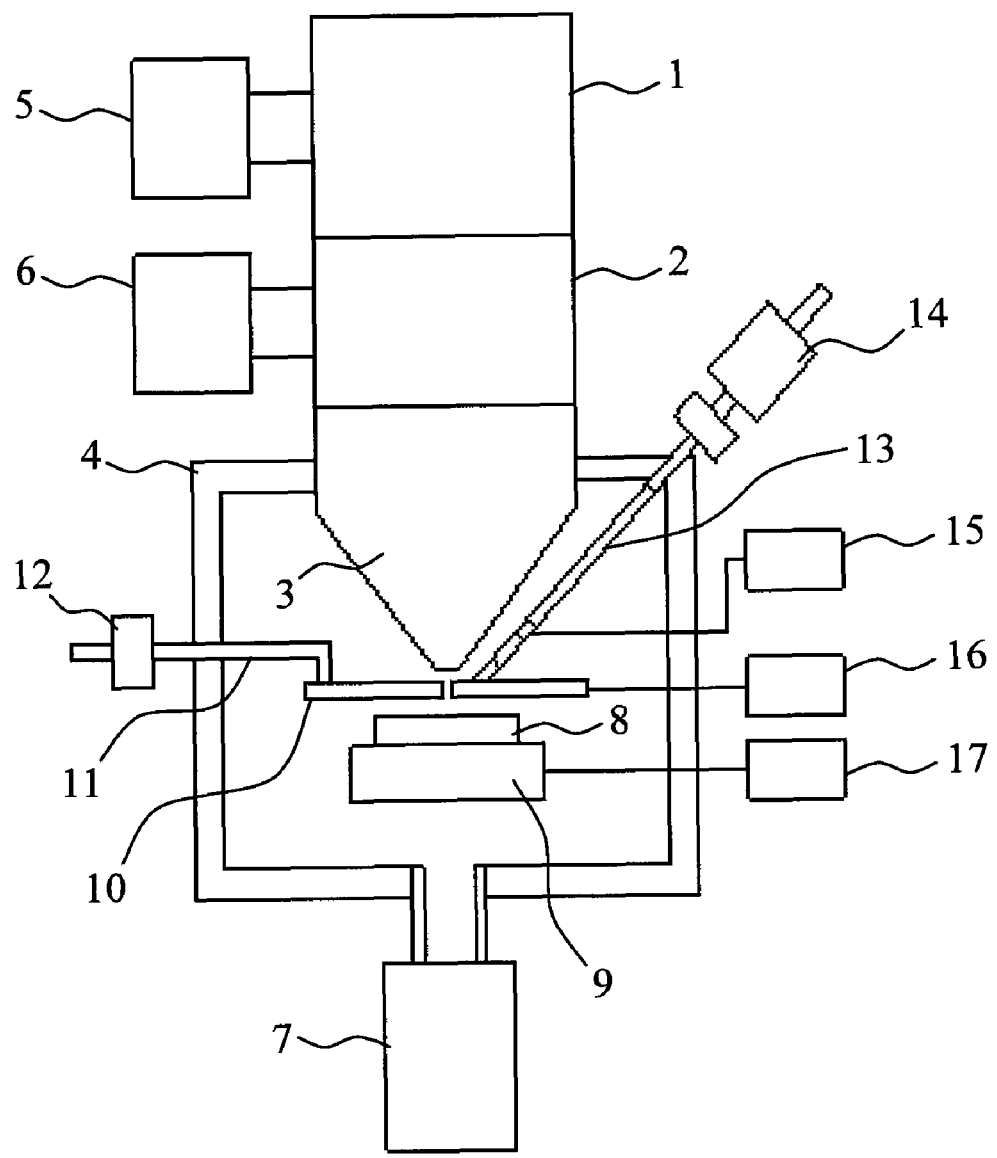
FIG. 1 is a schematic configuration diagram of a charged particle beam device according to an embodiment of the present invention.

1: Electron gun
2: Optical system column
3: Optical system column including an objective lens
4: Sample chamber
5: Vacuum pump
6: Vacuum pump
7: Vacuum pump
8: Sample
9: Sample holder
10: Electrode
11: Gas introduction pipe
12: Gas flow rate regulator
13: Charged particle source
14: Gas flow rate regulator
15: Control power source
16: High-voltage power source
17: High-voltage power source
18: Objective lens
19: Deflector
20: ExB filter
21: Charged particle detector
22: Primary charged particle beam irradiation point on a sample
23: Local charge-neutralization charged particle source
24: Charged particle emission hole
25: Global charge-neutralization charged particle source
26: Charged particle emission hole
27: Ion collector
29: Gas-introduction charged particle source
30: Metal cylinder
31: Grid
32: Filament
33: High-vacuum charged particle source
34: Feedthrough
40: Electrode of a plasma charged particle source
41: Insulating cylinder of a plasma charged particle source
42: Electrode of a plasma charged particle source
43: Insulating cylinder of a plasma charged particle source
44: High-voltage power source
45: High-voltage power source
46: Plasma charged particle source
50: Electrode unit
51: Upper electrode
52: Lower electrode
53: Primary charged particle passage hole
54: Gas introduction path
55: Cylindrical orifice
56: Secondary electron orbit
60: Global charge-neutralization charged particle source
80: Resist film
81: Chromium film
82: Glass substrate
83: Primary electron beam
84: Global charge-neutralization ion
85: Local charge
86: Global charge
87: Positive local charge
88: Secondary electron
89: Equipotential line group representing a potential saddle point in a positive charge region

BEST MODE FOR CARRYING OUT THE INVENTION

The present invention relates to a technique of eliminating charge that occurs when a sample made partly or entirely of an insulator is irradiated with charged particles, and clearly and stably imaging the structure of a sample surface. More particularly, the present invention relates to a technique effectively used in critical dimension SEMs (Scanning Electron Microscope) which measure the dimension of a pattern formed on a photomask as an original pattern used in optical lithography, or on a semiconductor wafer manufactured by using the photomask.

In the following, an embodiment of the present invention will be described by reference to the accompanying drawings. Note that the present embodiment is merely an example upon practicing the present invention, and does not intend to limit the technical scope of the invention. The same reference numerals are assigned to components common in the respective drawings.

[Configuration of Charged Particle Beam Device]

FIG. 1 is a schematic configuration diagram of a charged particle beam device according to an embodiment of the present invention. The principle and advantages of the present invention can be applied to a general charged particle beam device such as an FIB and an SEM. An example of applying the present invention to the SEM will be described below.

In the SEM according to the present embodiment, an electron beam generated in an electron gun 1 is magnified or demagnified in an optical system column 2, and an optical system column 3 including an objective lens 18. An insulator sample 8 is irradiated with the electron beam. A vacuum pump 5 is a pump which exhausts air in the electron gun 1 to an ultrahigh vacuum level. A vacuum pump 6 is a pump which exhausts air in the optical system column 2 and the optical system column 3 to a high vacuum level. When a pressure inside the optical system column 3 needs to be further reduced, a pump separate from the vacuum pump 6 may be also provided on the optical system column 3. A vacuum pump 7 exhausts air in a sample chamber 4. A pressure therein is thereby reduced to a pressure on the order of $10^{-4}$ Pa to $10^{-5}$ Pa.

The insulator sample 8 is placed on a sample holder 9 including a moving mechanism. The insulator sample 8 is thereby movable within the sample chamber 4. An electrode 10 as disclosed in Patent Document 3 is arranged between the sample 8 and the column 3. The electrode 10 has a size large enough to cover the entire moving range of the sample 8, and is disposed facing the sample 8. The electrode 10 and the sample holder 9 are connected respectively independently to a high-voltage power source 16 and a high-voltage power source 17. A retarding method may be applied to decelerate the primary electron beam emitted onto the sample.

A gas introduction path may be also provided in the electrode 10. A gas introduction pipe 11 including a gas flow rate regulator 12 is connected to the gas introduction path, so that a gas can be introduced from outside a vacuum onto the sample. A charged particle source 13 is further connected to the electrode 10. The charged particle source 13 will be described in detail below. The charged particle source 13 produces ions by gas ionization performed in a control power source 15 to neutralize charge. When a large amount of ions is required, a gas can be introduced through a gas flow rate regulator 14.

Figure 9:
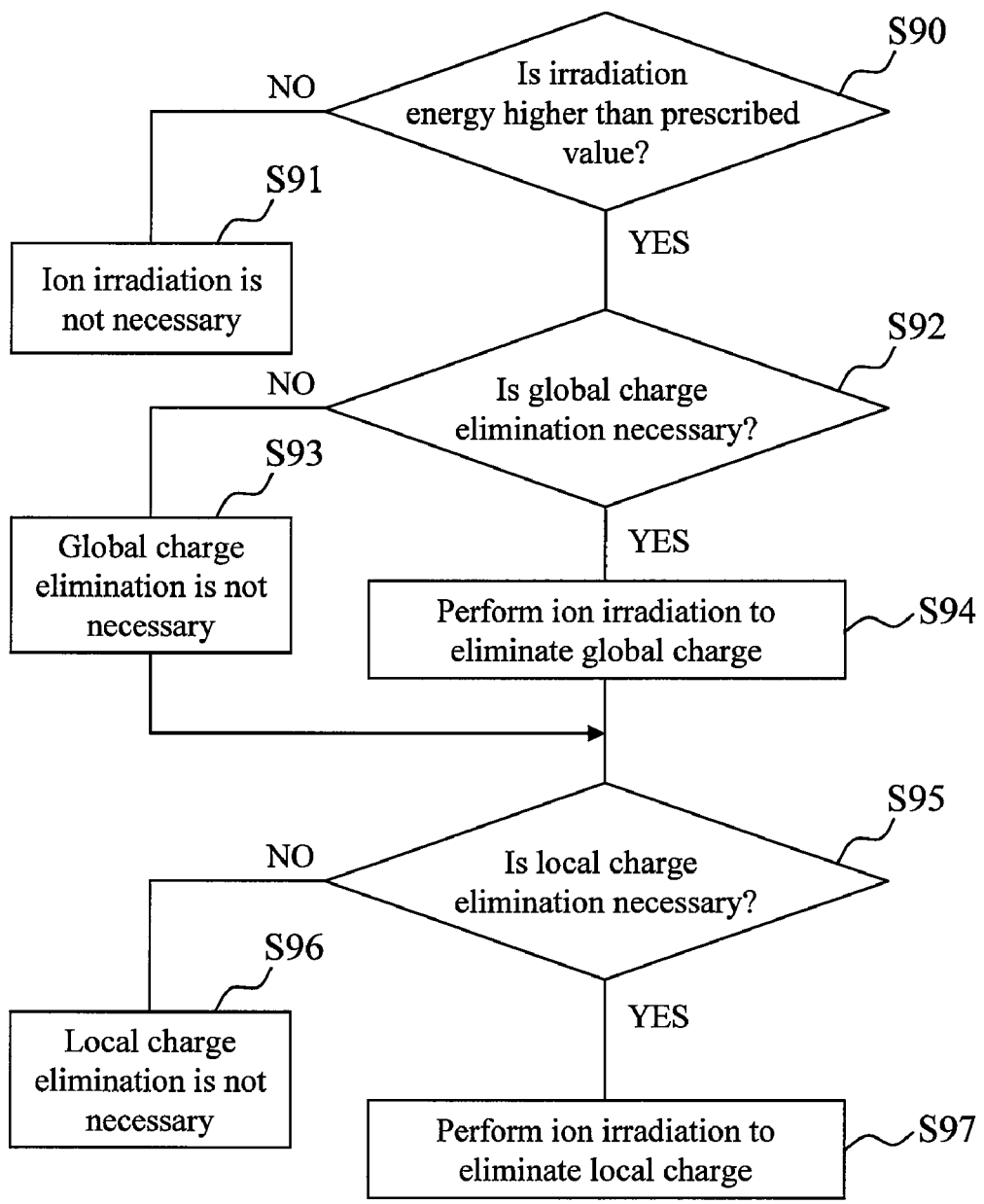
FIG. 9 is a flowchart for explaining a sequence for automatically performing charge elimination.

The gas flow rate regulators 12 and 14 are respectively connected to gas canisters. An inert gas whose ionization cross-section by electron impact is relatively large, such as nitrogen and argon, is used. An unillustrated control section (for example, CPU) performs various controls such as control of the vacuum pumps 5 and 6, movement control of the sample holder 9 (a stage), gas introduction control, and charge neutralization control using ions of charged particles. Furthermore, a charge elimination process may be performed under control of the CPU by providing a memory in which a computer program corresponding to a flowchart in FIG. 9 is stored, and reading the program at the time of control, for example.

[Configuration of Optical System Column]

Figure 2:
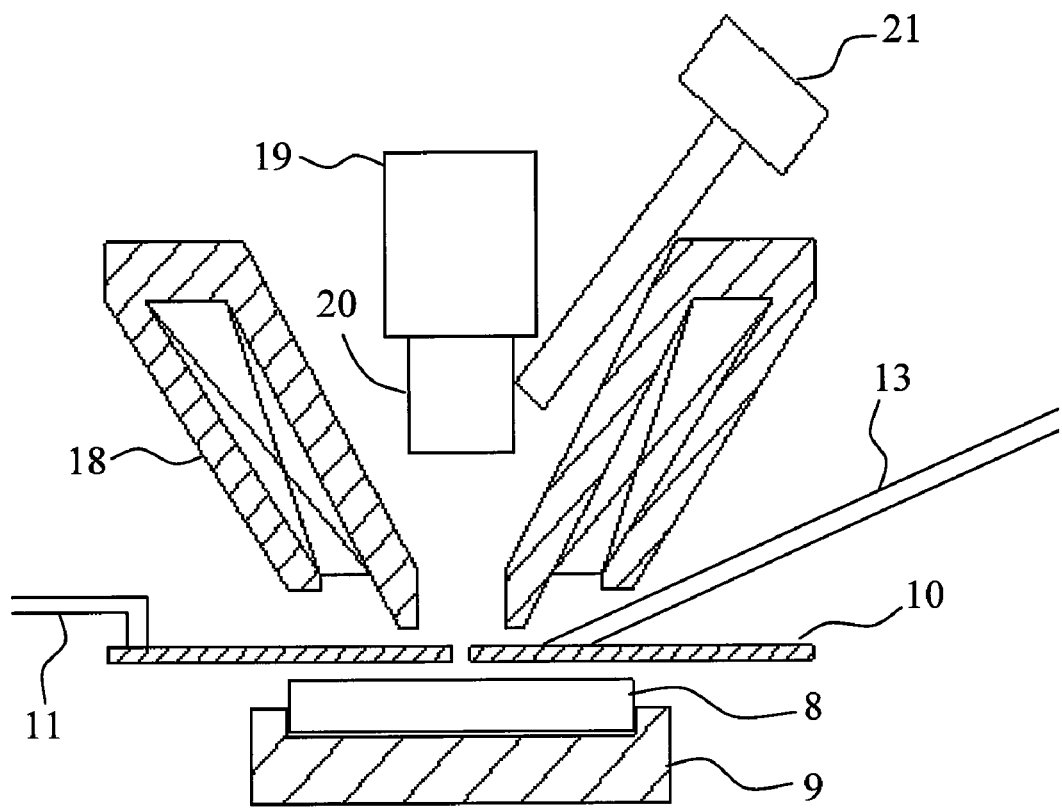
FIG. 2 is a view illustrating a positional relationship between an objective lens and an electrode unit.

FIG. 2 is a schematic configuration diagram of the optical system column 3 including the objective lens and a region in the vicinity thereof as a portion of the aforementioned charged particle beam device.

The electrode 10 is arranged between the objective lens 18 and the sample 8. A distance between the sample 8 and the electrode 10 is about 1 mm. A distance between an upper end portion of the sample 8 and the objective lens 18 is about 3 mm. The objective lens 18 is a magnetic field immersion-type semi-in-lens capable of achieving higher resolution. By using the semi-in-lens and a configuration described below, the efficiency of ion production can be also improved.

A detection unit including a so-called ExB filter 20 capable of deflecting only secondary electrons generated from the sample without changing the orbit of the primary electron beam and an Everhart-Thornley charged particle detector 21, and a deflector 19 which scans the primary electron beam on the sample are arranged above the objective lens 18.

A high voltage of about 10 kV is applied to the deflector 19 when the deflector 19 is an electrostatic deflector, and also to the charged particle detector 21. The high voltage is normally applied in a high vacuum in order to prevent discharge. The deflector 19, and the detection unit 20 and 21 are not limited to the configurations in the present embodiment, and a configuration as employed in a general charged particle beam device may be also used. Such configuration can be directly used since a neutralization charged particle source described below can be employed.

[Configuration of Charge-Neutralization Charged Particle Source]

Figure 3:
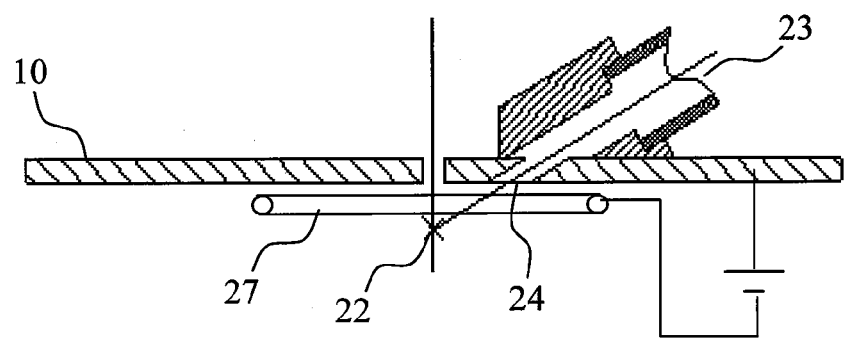
FIGS. 3 are views illustrating the configurations of a local charge-neutralization charged particle source and a global charge-neutralization charged particle source.
Figure 3:
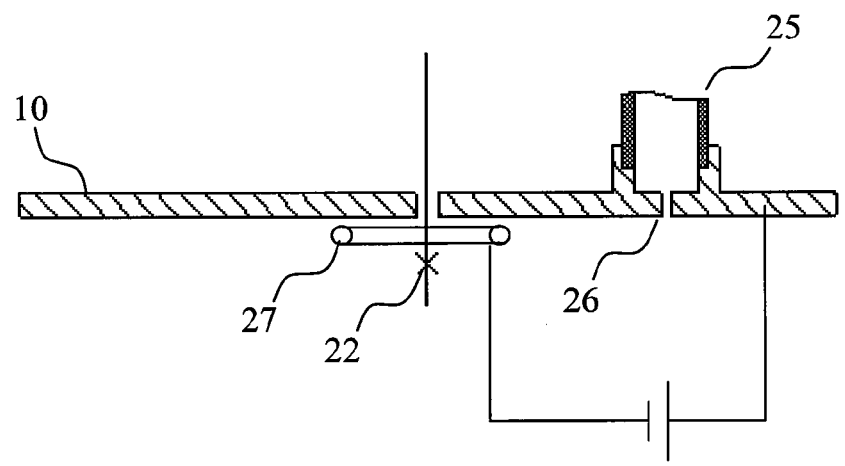

FIGS. 3 show configuration examples of neutralization charged particle sources for local charge and global charge.

FIG. 3(a) shows an example in which a local charge-neutralization charged particle source 23 is provided on the electrode 10. The central axis of a charged particle emission hole 24 of the charged particle source 23 has a positional relationship to cross a primary electron beam irradiation point 22 on the sample. Charged particles emitted from the charged particle source 23 are thereby directed straight to the primary electron beam irradiation point 22 on the sample as a position to induce charge. Accordingly, the primary electron beam irradiation point 22 can be effectively irradiated with the charged particles.

FIG. 3(b) shows an example in which a global charge-neutralization charged particle source 25 is provided on the electrode 10. Since the global charge causes a potential change over a wide range of the insulator sample, charged particles from the charged particle source 25 do not need to be directed straight to the primary electron beam irradiation point 22. The charged particle source 25 may be provided at a position offset from the optical axis. Accordingly, position interference between the global charge-neutralization charged particle source 25 and the local charge-neutralization charged particle source 23 can be avoided.

[Configuration of Charged Particle Beam Generation Source]

Figure 4:
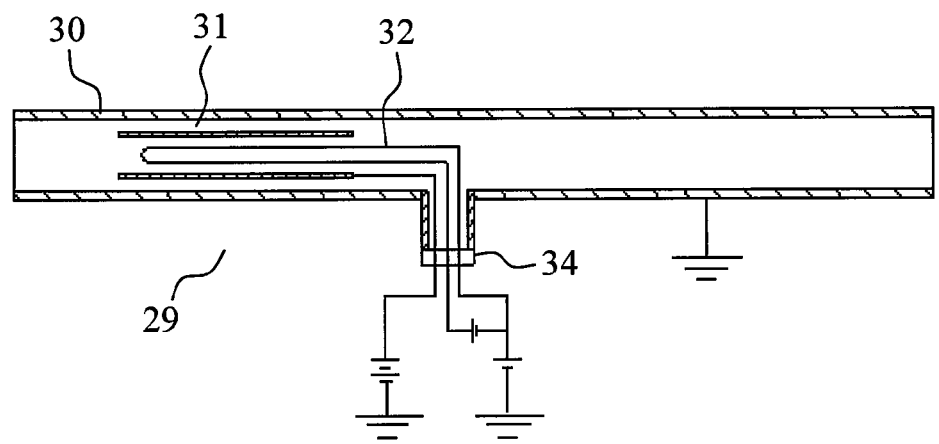
FIGS. 4 are views illustrating examples of a neutralization charged particle source.
Figure 4:
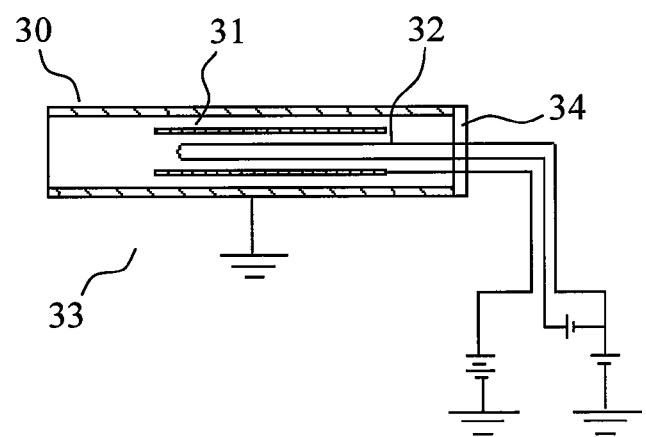
Figure 5:
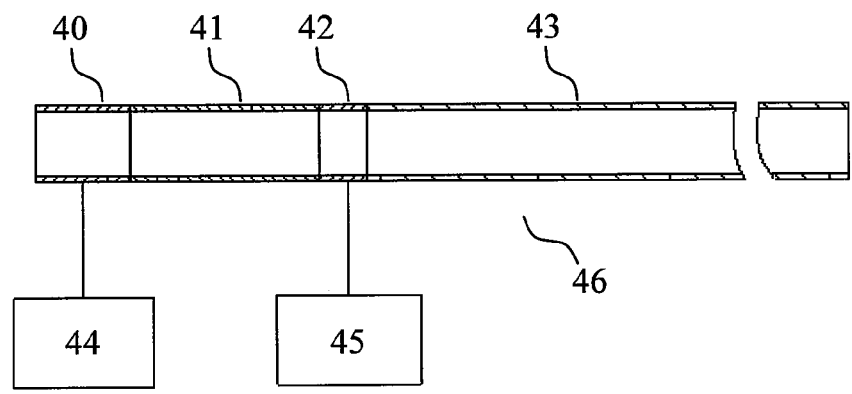
FIG. 5 is a view illustrating another example of the neutralization charged particle source.

FIGS. 4 and 5 show examples of a charged particle generation source which can be used for both the local charge-neutralization charged particle source 23 and the global charge-neutralization charged particle source 25.

FIG. 4(a) shows a charged particle source 29 (corresponding to reference numeral 13 in FIG. 1) having a similar structure to that of a triode or an ionization vacuum gauge, and including a filament 32 which generates thermal electrons when an electric current is applied thereto and a mesh or coil grid 31 which accelerates and absorbs the thermal electrons in a metal cylinder 30 with an inner diameter of a few mm.

In FIG. 4(a), the filament 32 has a higher positive potential than the grounded metal cylinder 30 by several ten volts. The grid 31 has a higher positive potential than the filament 32 by several hundred volts to ionize a gas by electron impact between the filament 32 and the metal cylinder 30, thereby producing ions and electrons.

A left opening portion of the charged particle source 29 is connected to the electrode 10, and a right opening portion thereof is connected to the gas flow rate regulator 14, so that a gas can be introduced onto the sample 8. When a voltage is applied to the electrode 10 to which the charged particle source 29 is connected, the metal cylinder 30 may be partly or entirely made of an insulator such as glass in order to insulate the gas flow rate regulator 14 from the electrode 10.

When a gas is introduced, the produced ions are ejected along with a gas flow generated due to a pressure difference between a pressure inside the charged particle source 29 and a pressure outside the charged particle emission hole 24 (see FIG. 3). Thus, it is not necessary to provide an electrode for drawing out ions to neutralize negative charge induced by a primary electron beam of high energy, so that the primary electron beam irradiation point 22 can be irradiated with ions of low energy (see FIG. 3). When the charged particle emission hole 24 is set to about $\phi$0.5 mm or less, the charged particle source 29 has an inner pressure of several pascals (Pa). Thus, the high vacuum in the sample chamber 4 can be maintained with the vacuum degree being decreased only by one order of magnitude from the achieved vacuum degree. Although the hole diameter of the charged particle emission hole 24 is at the aforementioned level, a sufficient amount of ions can be produced by increasing the thermal electrons emitted from the filament 32.

A primary electron beam of about several pA to several hundred pA is used in the SEM. In the present embodiment, even when a gas is not introduced, a sufficient amount of ions can be obtained since ions of about 1 nA are produced when the thermal electron emission amount of the filament 32 is set to 10 µm in the sample chamber. Thus, a charged particle source 33 in which a feedthrough 34 is provided at the right opening portion of the metal cylinder 30 as shown in FIG. 4(b) may be also employed. Also, when a gas is not introduced, a charged particle emission hole 26 (see FIG. 3) may have a size equal to that of the metal cylinder 30 to facilitate ion diffusion. Accordingly, the charged particle source 33 is preferably used as the global charge-neutralization charged particle source 25, and the amount of ion production can be easily controlled by the amount of thermal electrons.

FIG. 5 shows a charged particle source where a glass or ceramic insulating cylinder 41 is provided between a metal electrode 40 and a metal electrode 42. The charged particle source in FIG. 5 is shaped as a cylindrical pipe with an inner diameter of about 5 mm. The charged particle source 46 has a left opening portion connected to the electrode 10, and creates a potential difference between the electrodes 40 and 42 by a high-voltage power source 44 or 45 in a state in which a gas is introduced therein. Accordingly, continuous discharge occurs and plasma is produced within the insulating cylinder 41. The high-voltage power sources 44 and 45 correspond to the control power sources 15 and 16 in FIG. 1.

In the configuration in FIG. 5, the insulating cylinder 43 is connected to the grounded gas flow rate regulator 14 to introduce a gas. Thus, the insulating cylinder 43 may be set to a sufficient length so as not to produce plasma even when a high voltage is applied to the electrode 42 from the high-voltage power source 45. To be more specific, when (the gas pressure)×(the length of the insulating cylinder 43) is set to 400 Pa/mm or more, the discharge within the insulating cylinder 43 can be prevented even when the high-voltage power source 45 applies a practical voltage.

In the present embodiment (FIG. 3), the charged particle emission hole 24 is $\phi$40.5 mm and the insulating cylinder 41 has a length of 20 mm, for example. The electrode 40 is connected to the electrode 10 to obtain a ground potential, and a gas of about 40 Pa is introduced. When a positive or negative direct-current voltage of about 1 kV is applied to the electrode 42, continuous discharge occurs. Accordingly, ions of several hundred pA to several hundred nA can be obtained on the sample.

[Configuration of Electrode Unit]

Figure 6:
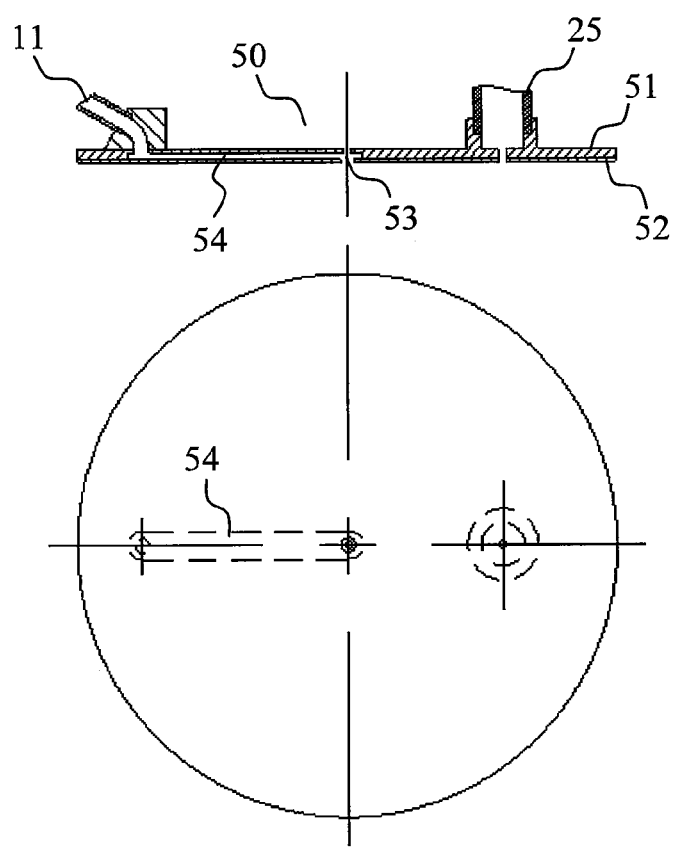
FIG. 6 is a view illustrating a configuration example of the electrode unit including the global charge-neutralization charged particle source and the local charge-neutralization charged particle source.

FIG. 6 shows an electrode unit 50 (corresponding to the electrode 10 in FIG. 1) including the local charge-neutralization charged particle source, and the global charge-neutralization charged particle source 25.

In the local charge-neutralization charged particle source, an introduction path 54 for a gas to be supplied from the gas introduction pipe 11 is provided in the electrode 10. The gas is ionized by the primary electron beam or the secondary electrons in a local low-vacuum region formed in the vicinity of a charged particle passage hole 53.

Meanwhile, any type of charged particle source shown in FIGS. 4 and 5 can be used as the global charge-neutralization charged particle source 25.

The electrode 50 has a circular or square shape having the primary charged particle passage hole 53 in the center. The electrode 50 may also have any shape as long as the electrode 50 is always disposed facing the upper portion of the sample 8 even when the sample 8 is moved. The electrode 50 has a structure in which an upper electrode 51 and a lower electrode 52 are bonded together. The electrodes may be bonded together by welding, or using an adhesive or a screw.

By forming the groove-shaped gas introduction path 54 in one or both of the upper electrode 51 and the lower electrode 52, the thickness of the electrode 10 can be reduced to about 1 mm. Thus, the electrode can be arranged in a small space within a limited WD.

Furthermore, when a retarding voltage is applied to the electrode arranged between the objective lens 18 and the sample 8, aberration of the primary electron beam can be reduced.

In the present embodiment, the gas introduction path 54 has a width of about 4 mm, and a groove depth of about 0.3 mm. When the primary charged particle hole 53 is about $\phi$1 mm, a gas flow rate by which the pressure in the sample chamber 4 is maintained at a high vacuum on the order of $10^{-3}$ Pa can be achieved without changing an exhaust system of a normal SEM. A local gas pressure in the hole 53 can be set to several Pa.

In the primary charged particle passage hole 53, the hole diameters of the upper and lower electrodes 51 and 52 may be different from each other. Preferably, the hole diameter of the upper electrode 51 is made smaller than the hole diameter of the lower electrode 52, so that the amount of introduced gas flowing into the optical system column 3 can be reduced. Accordingly, discharge and noise signals in the deflector 19 and the charged particle detector 21 can be eliminated, and the gas is allowed to locally exist between the primary charged particle passage hole 53 and the sample 8. As a result, a resolution deterioration or a decrease in S/N due to the scattering of the primary electron beam or the secondary electrons detected by the charged particle detector 21 can be minimized.

When the electrode unit 50 in FIG. 6 is applied to the SEM to observe the insulator sample such as a resist photomask, an SEM image where the charge is eliminated and no abnormal contrast nor temporal change in brightness due to the charge is observed can be obtained.

However, if the raster scan rate of the primary electron beam is faster than a TV rate, the local charge neutralization effect may be reduced. This is because the remaining time of the primary electron beam in the local gas becomes shorter, thereby reducing the ionization efficiency. This is also because continuously induced negative charge in a small region corresponding to the pixel size of the image cannot be performed in time when the primary electron beam irradiation point is moved since the ions have a larger mass than the electrons and thus move slowly.

When the scan rate of the primary electron beam is fast, the S/N may be reduced and the charge neutralization efficiency may be deteriorated. However, on the contrary, it is not preferable to reduce the scan rate since the critical dimension SEM needs a high throughput. To solve the problem, the irradiation amount of the primary electron beam may be increased, and also, an ion density may be increased by improving the local ionization efficiency.

Figure 7:
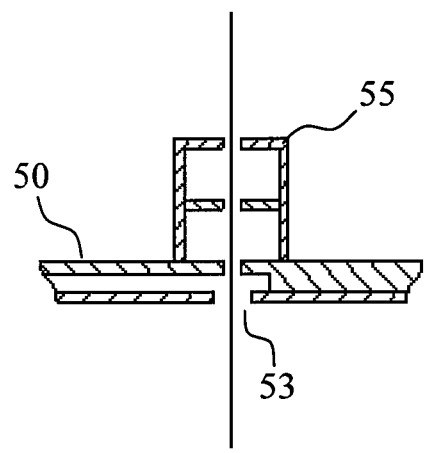
FIGS. 7 are schematic views of the electrode unit including a gas flow rate regulating orifice.
Figure 7:
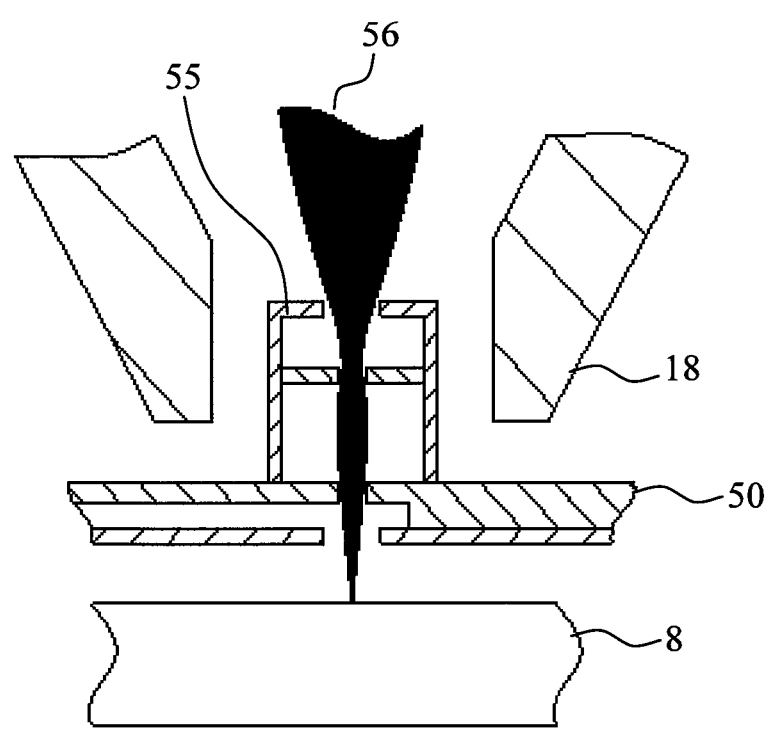

As shown in FIG. 7(a), in order to increase the ionization efficiency by raising the gas pressure in the vicinity of the primary charged particle passage hole 53, a cylindrical orifice 55 may be provided on the upper electrode 51. The cylindrical orifice 55 is obtained by typically stacking a plurality of orifices of $\phi$0.5 mm to $\phi$1 mm. The central axes thereof are disposed corresponding to the central axis of the primary electron beam passage hole 53. Although only two orifices are stacked in the drawing, the present invention is not limited thereto in a practical case. Since the plurality of orifices are stacked, conductance can be increased in parallel. Since a space between the orifices is on the order of mm, a differential pressure in each space sectioned by the orifices can be reduced. At least the pressure in the primary charged particle passage hole 53 or the adjacent space can be increased to several times the local gas pressure obtained when the cylindrical orifice 55 is not provided. As a result, the local charge can be neutralized even when the scan rate is made faster or the dose of the primary electron beam is increased to several hundred pA.

The positions and hole diameters of the orifices of the cylindrical orifice 55 may be determined based on a secondary electron orbit 56 obtained by a simulation as shown in FIG. 7(b). The loss of the secondary electrons generated from the sample 8 can be thereby minimized.

Furthermore, since the space is sectioned by the orifices, stray secondary electrons scattered by the gas can be prevented from reaching the charged particle detector 21. An image signal with good S/N can be thereby acquired.

[Modification]

Figure 8:
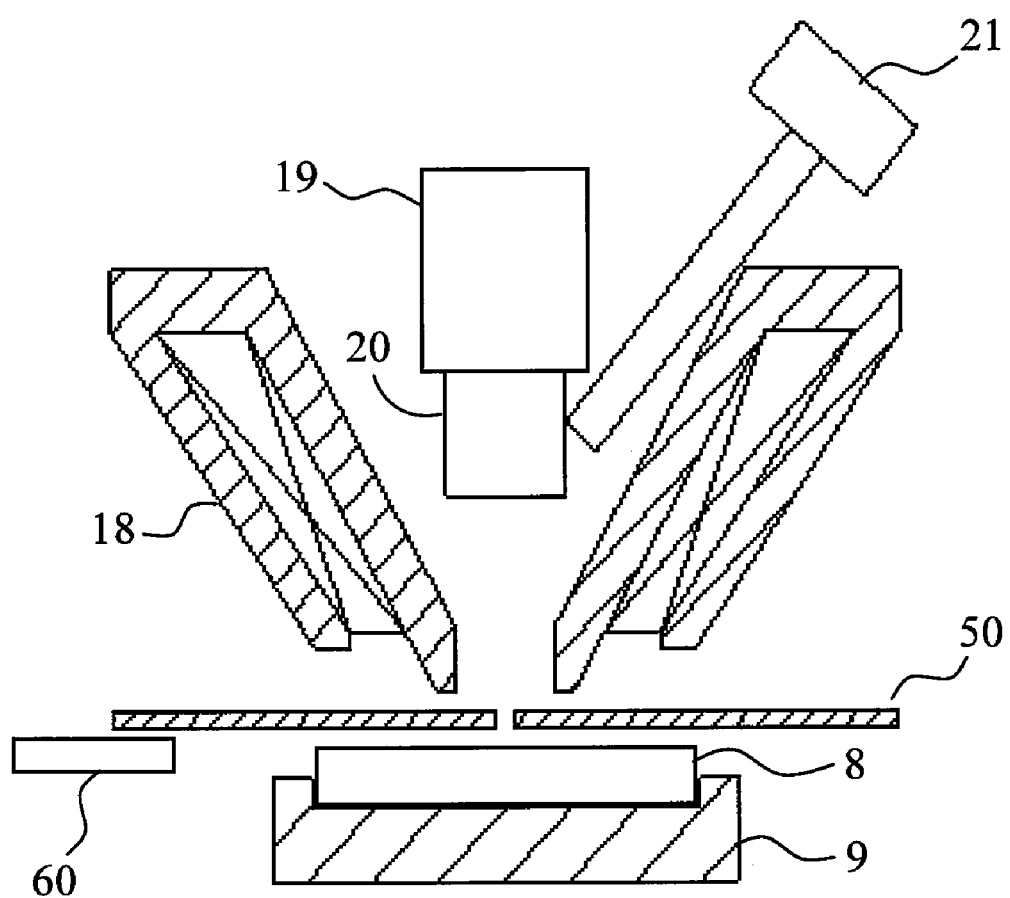
FIG. 8 is a view for explaining the arrangement of the global charge-neutralization charged particle source.

As a modification similar to the electrode unit 50, the global charge-neutralization charged particle source 25 separable from the electrode unit 50 may be disposed at a position facing the insulator sample 8 below the electrode unit as shown in FIG. 8. The configurations shown in FIGS. 4 and 5 may be applied to a global charge-neutralization charged particle source 60 disposed at the above position.

The electrode unit 50 and the sample holder 9 are used in a non-electric field or a low-electric field at the same electric potential, or with a potential difference of several volts to several ten bolts between the electrode unit 50 and the sample 8. Accordingly, ions from the charged particle source 60 can be diffused enough to sufficiently act on the global charge of the sample 8.

Particularly, in a case of using a resist photomask having a conductive film such as a chromium film and a laminated film of molybdenum and silicon, even when only a side surface of the photomask is irradiated with the ions, a sufficient global charge neutralization effect is obtained since charges are transferred at a high speed within the conductor.

[Automation control sequence of charge elimination]

In the present invention, a conventional method of using a primary electron beam having a low energy of several hundred eV may be used in observing an insulator sample. However, even when a primary electron beam having a high energy of several keV, which cannot be used in a conventional case, is used, a high-resolution and stable image can be effectively obtained and length measurement can be also effectively performed by eliminating induced negative charge.

Furthermore, while it is necessary to optimize parameters such as the amount, energy and scan rate of the primary electron beam with respect to each sample in the conventional technique, the negative charge can be automatically neutralized, or converted into positive charge to thereby converge by itself.

The automatic neutralization or self convergence of the charge can be achieved by the following points. As described above, as a first point, the global charge and the local charge are separately treated since the global charge and the local charge have different charging processes and charge densities from each other and it is thus difficult to simultaneously and quickly neutralize the global charge and the local charge. As a second point, since the ions of low energy are used, charges having a positive polarity opposite to that of the charge on the sample are not excessively accumulated, thereby causing only the, ions required for neutralizing the electrification charges to act on the charge. Accordingly, the charge elimination does not depend on the parameters of the primary electron beam. As a third point, control is performed such that the ion production amount is correlated with the dose of the irradiating primary electron beam.

Figure 10:
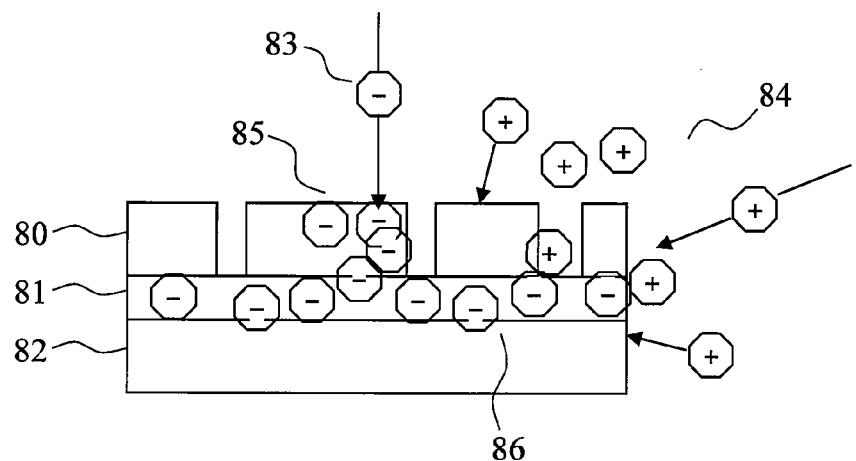
FIGS. 10 are views for explaining a neutralization process of global charge and local charge, and self-neutralization of the local charge.
Figure 10:
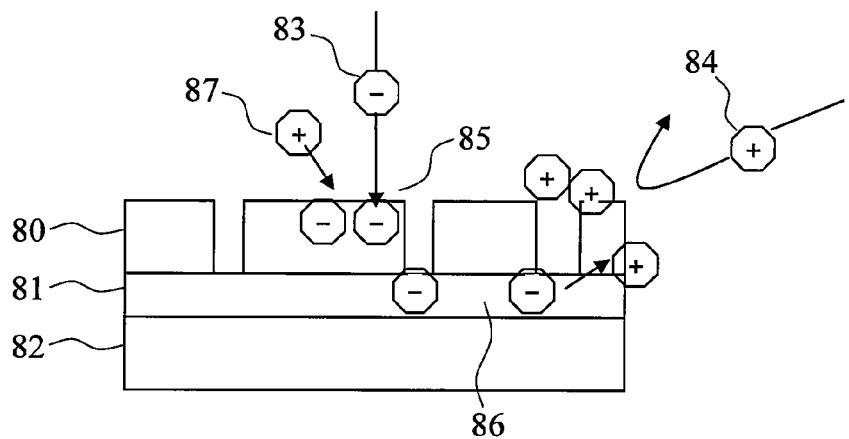
Figure 10:
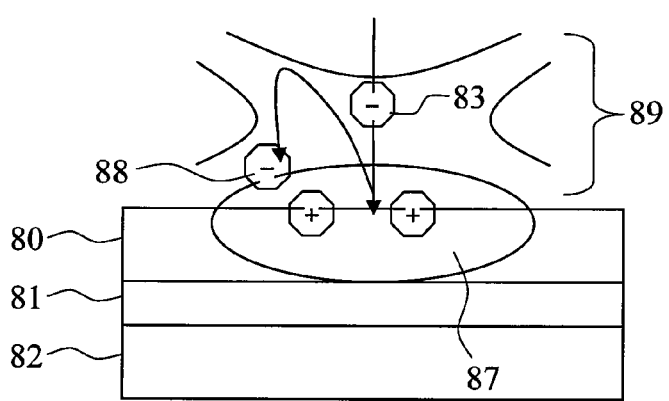

Based on the above points, the automation control sequence of the charge elimination process will be described below by reference to FIGS. 9 and 10. FIG. 9 is a flowchart for explaining the operation for automating the charge elimination. FIG. 10 are views for explaining the principle of neutralization.

The irradiation energy of the primary electron beam may be set manually or according to accompanying information of a recipe used in the critical dimension SEM, in which measurement positions and conditions are determined. The unillustrated control section (CPU) mainly performs each step unless otherwise noted.

First, in step S90, it is determined whether or not the irradiation energy of the primary electron beam is higher than a prescribed value. When the irradiation energy is lower than the prescribed value, the process moves to step S91, where the ion irradiation is determined to be unnecessary. When the irradiation energy is higher than the prescribed value, the process moves to step S92 to move into a sequence for ion irradiation. The prescribed value used in step S90 may be a value by which positive charge is obviously induced from the physicality of a material to be observed, for example, by which the second electron generation efficiency becomes 1 or more. When the energy is lower than the prescribed value, the primary electron beam of low energy is emitted without performing the ion irradiation. However, the global charge-neutralization charged particle source 25 or 60 may be kept operating regardless of the set energy of the primary electron beam.

Subsequently, in step S92, it is determined whether or not the global charge needs to be eliminated. When it is determined that the elimination is not necessary, the process moves to step S93, and the global charge-neutralization charged particle sources 25 and 60 are not operated. When it is determined that the elimination is necessary, the process moves to step S95, and the charged particle source 25 or 60 is operated.

The necessity of the global charge elimination may be determined by using a preliminarily created recipe so as to perform the necessity determination at an alignment point, at any one point, or at a plurality of points at regular time intervals in the critical dimension SEM.

To be more specific, in step S92, a change in focal position caused when the global charge changes the energy of the primary electron beam is used.

Generally, the SEM has an auto focus function. Thus, the objective lens 18 can be exactly focused by analyzing blur of an acquired image by image processing and scanning a focus current of the objective lens 18. A change in electric current when the objective lens 18 is exactly focused can be detected by performing the auto focus process two or more times in a row. This is because the negative global charge develops over time, and the primary electron beam is decelerated immediately above the sample, so that the focus current is reduced over time when the sample is irradiated with the primary electron beam having a high energy equal to or higher than the prescribed value.

Moreover, an SEM magnification when the auto focus process is performed is preferably a relatively low magnification of, for example, 3000 to 5000 times, by which pattern recognition is enabled and the temporal change of the global charge by the primary electron beam becomes prominent.

Although the auto focus function is employed in the present embodiment, a change in image blur within a certain time period may be also detected by image processing instead of the change in focus current in order to more simply detect the global charge in a shorter time.

Meanwhile, even when there occurs global charge that is not reflected in the change in focus current, the electrification charge amount thereof is small. Thus, such global charge can be eliminated by subsequent neutralization of the local charge.

An electromagnetic lens is used as the objective lens 18 in the present embodiment. Even when an electrostatic lens is used, it goes without saying that a focus change can be detected by a focus voltage applied to the electrostatic lens.

When the global charge is detected, the global charge-neutralization charged particle source 25 or 60 is operated (step S94). In this case, when the high-vacuum charged particle source 33 is used, the filament is energized to generate thermal electrons by applying a predetermined voltage to the grid 31 and the filament 32. A residual gas is thereby ionized. The ion amount usable in the charged particle source 33 can be changed by the thermal electron amount and the voltage applied to the grid 31. A relationship among the ion amount, the thermal electron amount and the applied voltage may be obtained in advance as a predetermined condition.

When ions are actually used, the high-vacuum charged particle source 33 may be operated so as to obtain an ion amount equal to the current amount of the primary electron beam which can be appropriately monitored. Accordingly, neutralization charges of the same level as those of the global charge can be automatically supplied.

When the gas-introduction charged particle source 29 or the plasma charged particle source 46 is used, the gas introduction is performed through the gas flow rate regulator 14 that is connected to the canister for feeding a gas such as nitrogen and argon during operation. At this time, a sufficient ion amount can be used while maintaining the pressure in the sample chamber 4 at a high vacuum level as described above even when the gas is introduced therein. It goes without saying that an operation condition for obtaining a required ion current is obtained in advance as described above.

The principle of the charge neutralization when the global charge-neutralization charged particle source 25 or 60 is operated as described above is shown in FIGS. 10(*a*) and 10(*b*).

In FIG. 10(*a*), the sample is an easily-charged typical ADI (After Developed Inspection) mask where a chromium film 81 and a resist film 80 are formed on a glass substrate 82. Negative charges accumulated by irradiation with the primary electron beam induce global charge 86. Positive ions 84 emitted from the charged particle source 25 or 60 are guided to a negative polarity to be neutralized. However, the positive ions 84 sense the electric field of the charges distributed in a wider range than those of local charge 85, and thus do not sufficiently act on the local charge 85. Actually, the ions continue to cancel the electrons of the supplied primary electron beam.

FIG. 10(*b*) is a schematic view of a state in which the neutralization further progresses and the global charge is almost neutralized. In the neutralization of the global charge 86, even when an excessive amount of ions adhere to the sample to form a positive potential, ions are not excessively accumulated since the positive ions 84 are repelled by the positive potential, so that the global charge converges. Redundant ions which do not contribute to the neutralization of the global charge are mostly neutralized by colliding with the electrode unit 50 or members around the electrode unit 50. In the case where the gas is introduced into the charged particle source 25 or 60, stray ions increase to become electric noise or noise components in a detection signal, or charge an insulating member that constitutes the charged particle beam device to make the voltage unstable or cause discharge.

To avoid the above problems, an ion collector 27 as a ring-shaped wire shown in FIGS. 3(*a*) and 3(*b*) is arranged as shown in each drawing. When a low negative voltage of several volts is applied to the electrode 10 or the electrode unit 50, the electric field acting on the ions generated by the negative charge is not effectively affected.

Since a non-electric field or only a low-electric field exists in the space irradiated with the ions, the redundant ions of low energy can be effectively collected by the ion collector 27.

With the process of eliminating the global charge as described above, when a sample where global charge occurs by charges accumulated before being irradiated with the primary electron beam, that is, in a manufacturing process or handling (there actually is such a sample) is transferred into the sample chamber 4, the global charge is quickly neutralized.

Since the global charge is macroscopic charge, the global charge can be sensed by a measurement sensor such as a Kelvin probe which can be used for measuring the electric potential of the sample surface. Thus, by providing the measurement sensor in the sample chamber 4, or at an entrance or in an anterior chamber of the sample chamber 4 (not shown), the charged particle source 25 or 60 may be operated when the measurement sensor senses the charge.

Even when the charge is positive charge, the charge can be neutralized since electrons are also generated in the charged particle source.

Returning to FIG. 9, it is then determined whether or not the local charge needs to be eliminated (step S95). Since the local charge does not affect the focus of the primary electron beam a lot, it is not possible to determine the necessity of elimination by using the same conditions as the global charge. The local charge is considered to cause charge accumulation or charge transfer due to an unstable electric field caused by the charge accumulation in the region irradiated with the primary electron beam and a region where the secondary electrons generated from the irradiated region are scattered and land on the sample. Step S95 may be also performed before step S92. Alternatively, step S95 and step S92 may be independently processed.

An actual phenomenon of the local charge is recognized by an operator as a factor to determine the presence of charge via an SEM image. To be more specific, as an example depending on a pattern, a circular contact hole may be observed as an oval shape, or an obvious change in dimension of a line or a space, or a partial curve may be observed. However, the dimension change or partial curve can be recognized only after the portion is measured, and is thus difficult to use as a practical determination condition.

An example of a determination method that does not depend on a pattern includes a method of detecting contrast reversal by image processing by comparing an image with an image with no charge or with positive local charge acquired using a charged particle beam of lower energy than the prescribed value in advance. Also, in the critical dimension SEM, a measurement position can be recognized based on CAD data as a design drawing. Thus, information on whether a resist film or an insulating film exists is obtained from the CAD data in advance. When the resist film or the insulating film exists, it can be determined that the ion irradiation is necessary.

The aforementioned two methods for determining the necessity use the preliminarily prepared determination condition. A method of detecting dynamic induction of charge as described below may be also employed.

When the sample is irradiated with the primary electron beam having a higher energy than the prescribed value used in step S90, the negative charge is induced. The secondary electrons are thereby emitted. The secondary electrons are accelerated in the direction of the electrode unit 50 to pass through the hole 53, and detected by the charged particle detector 21. The detected secondary electrons cause an increase in brightness of the SEM image since the negative charge develops over time from immediately after the primary electron beam irradiation. This is an opposite phenomenon to a phenomenon in which brightness decreases when the secondary electrons return to the sample side due to a potential saddle point formed when positive charge is induced.

Accordingly, an increase in signal amount incident on the charged particle detector 21 may be electrically monitored, or a change in average brightness may be detected from the digital gradation of pixels of the SEM image. When there is a temporal increase in signal amount, it is determined that the ion irradiation needs to be performed (the local charge needs to be eliminated) (step S95). More simply, the elimination necessity may be determined based on a condition that the signal amount is larger than a prescribed value correlated with the negative charge determined in advance.

In order not to deteriorate a throughput at the time of acquiring the signal amount or the image, a signal from only one line of scanning of the primary electron beam, one frame of the image, or a region constituted by a plurality of lines sufficiently smaller than the entire region of one field may be used. Additionally, drift of the primary electron beam generated by the uneven electric field of the local charge may be directly detected from image movement, and the ion irradiation may be performed when the drift is detected.

An SEM magnification used to determine the necessity of the local charge elimination is larger than the SEM magnification used to determine the necessity of the global charge elimination in order to detect the local charge with high sensitivity and high S/N. A magnification used for measuring a micro pattern in a practical case, more specifically, a magnification of 50000 times or more is preferably used.

The necessity of the local charge elimination may be determined at the same position as that used to determine the necessity of the global charge elimination, or by using a characteristic pattern such as a contact hole. The position can be specified in a recipe in the critical dimension SEM, or any position which is possibly charged can be selected in an SEM for manual use.

When it is determined that the local charge elimination is necessary, the ion irradiation is performed in step S97. The local charge-neutralization charged particle source 23 or the configuration to locally introduce a gas provided in the electrode unit 50 is activated as an ion generation source, so that the local charge in the region irradiated with the primary electron beam is effectively neutralized.

The configurations shown in FIGS. 4 and 5 can be employed in the charged particle source 23 in a similar manner to the global charge-neutralization charged particle source 25. It goes without saying that the configurations can be used in the same operating method as that described in step S94 with respect to the global charge. However, the charged particle source 23 or the configuration to locally introduce a gas provided in the electrode unit 50 may be kept operating regardless of the set energy of the primary electron beam by adding a selection condition to the conditions for determining the necessity of the local charge elimination in a similar manner to the global charge.

The principle of the local charge neutralization will be described by using FIGS. 10(*a*) to (*c*) in a similar manner to the global charge. As shown in FIG. 10(*a*), when the sample is irradiated with a primary electron beam 83, the local charge 85 is induced in the resist portion 80. The global charge-neutralization ions 84 cannot neutralize the local charge 85 in a pinpoint manner. Even when the global charge 86 is neutralized, the local charge 85 having a charge density different from that of the global charge is continuously induced by the incident primary electron beam 83 as shown in FIG. 10(*b*).

By using the charged particle source of the present invention capable of effectively supplying ions to the local charge region, ions 87 can reach the local charge 85 to thereby neutralize the local charge 85.

As shown in FIG. 10(*c*), even when the charge is converted into positive local charge 87 due to excessive ions, a potential saddle point 89 is formed directly above the positive charge. Emitted secondary electrons 88 of low energy thereby return to the sample to neutralize the positive local charge 87. Accordingly, the charge converges by itself

[Conclusion]

The charged particle beam device can eliminate the charge generated when the insulator or the sample including the insulator, particularly, a pattern on a photomask or a semiconductor wafer with a resist attached to the surface is observed or the length measurement is performed thereon. Since the device can achieve higher resolution, a high-resolution image, and stable length measurement accuracy and reproducibility can be obtained without being affected by the charge.

In the embodiment of the present invention, the electrode unit including the local charge-neutralization charged particle source and the global charge-neutralization charged particle source is disposed facing the sample, and the sample is irradiated with the primary charged particle beam having a high energy to induce negative charge. Both the neutralization charged particle sources have a compact structure to produce ions and electrons by discharge or electron impact by introducing a gas. The neutralization charged particles are emitted with low energy between the sample and the electrode unit in a non-electric field or in a slightly biased state.

Particularly, in the local charge-neutralization charged particle source, the local low-vacuum region is effectively formed directly above the region irradiated with the primary charged particle beam by introducing a gas into the path provided in the electrode unit, and the introduced gas is ionized relative to the amount of the secondary electrons (and reflected electrons) generated from the sample. Accordingly, the charged particles corresponding to the polarity of the charge by the produced ions and electrons are preferably used for neutralizing the local charge in a self-bias manner.

Furthermore, since the local low vacuum can be achieved, the configuration of a normal charged particle beam device or a unit such as a signal detection system can be directly used without deteriorating the performance. Also, the resolution is improved since the primary charged particle beam of high energy, which normally cannot be used for the insulator, can be used, and the thickness of the electrode unit and the WD can be reduced.

As described above, the electrode unit in the present embodiment exerts the self neutralization effect of the global charge and the local charge only by combining the special neutralization charged particle sources respectively for the global charge and the local charge which are arranged in a characteristic manner to generate the neutralization charged particles also in a characteristic manner. As a result, the present invention differs from Patent Document 7 in that the sample is truly maintained in a neutralized state.

Moreover, according to the present embodiment, the charge converges by itself, and the neutralization charged particles do not cause excessive charge. Thus, an excessive amount of neutralization charged particles can be supplied with respect to the charge amount equal to the irradiation charge amount of the primary charged particle beam.

As a result, it is not necessary to set the irradiation condition of the primary charged particle beam to relax the charge depending on the sample as in the conventional case. Only the operation of the neutralization charged particle source can be determined by electrically detecting the temporal focus change in the auto focus function or the change in image brightness. The global charge and the local charge can be thereby automatically eliminated at the same time or independently from each other.

The invention claimed is:

1. An electrode unit comprising a plate electrode disposed facing an insulator sample between an objective lens and the sample, further comprising:
    a first charge-neutralization charged particle beam source which emits a first charged particle beam to eliminate local charge on the sample; and
    a second charge-neutralization charged particle beam source which emits a second charged particle beam to eliminate global charge on the sample,
    wherein a first hole through which a primary charged particle beam passes, and a second hole through which the second charged particle beam is emitted are provided in the plate electrode,
    the first and second charge-neutralization charged particle beam sources are disposed at such positions as not to interfere with each other, and
    the charged particle beam emitted from the first charge-neutralization charged particle beam source is introduced in the vicinity of the first hole.

2. The electrode unit according to claim 1, wherein the first and second charge-neutralization charged particle beam sources are used with an inert gas being introduced therein.

3. The electrode unit according to claim 1, wherein a third hole through which the first charged particle beam is emitted diagonally relative to the plate electrode is provided in the plate electrode, and
    the primary charged particle beam passing through the first hole and the first charged particle beam emitted through the third hole cross each other in the vicinity of a position where the first charged particle beam is introduced on the sample.

4. The electrode unit according to claim 1, wherein the first hole has a smaller diameter on an incident side of the primary charged particle beam than a diameter on an emission side.

5. The electrode unit according to claim 4, wherein the plate electrode comprises a cylindrical multistage orifice on the incident side of the primary charged particle beam.

6. The electrode unit according to claim 1, wherein the plate electrode has a size large enough to cover an entire moving range of the sample such that the sample does not project from the plate electrode.

7. The electrode unit according to claim 1, further comprising an ion collector in the vicinity of the first hole below the plate electrode.

8. A charged particle beam device for irradiating a sample with a charged particle beam to observe the sample, comprising:
    a primary charged particle beam source which emits a primary charged particle beam;
    an objective lens;
    an electrode unit according to claim 1 disposed between the sample and the objective lens; and
    a control section which controls operation of the first and second charge-neutralization charged particle beam sources,
    wherein the control section operates at least one of the first and second charge-neutralization charged particle beam sources when irradiation energy of the primary charged particle beam source is higher than a prescribed value.

9. The charged particle beam device according to claim 8, wherein the control section determines whether or not to operate the second charge-neutralization charged particle beam source based on a temporal change in focus current value or focus voltage value of the objective lens.

10. The charged particle beam device according to claim 8, wherein the control section determines whether or not to operate the second charge-neutralization charged particle beam source based on a temporal change in blur of an image of the sample.

11. The charged particle beam device according to claim 8, wherein the control section determines whether or not to operate the second charge-neutralization charged particle beam source based on a measurement result of a surface electrometer which measures a surface potential of the sample.

12. The charged particle beam device according to claim 8, wherein the control section determines whether or not to operate the first charge-neutralization charged particle beam source based on whether contrast of an image of the sample is reversed as compared to a reference image.

13. The charged particle beam device according to claim 8, wherein the control section determines whether or not to operate the first charge-neutralization charged particle beam source based on information on the presence of an insulator at a position irradiated with the primary charged particle beam by using CAD data.

14. The charged particle beam device according to claim 8, wherein the control section determines whether or not to operate the first charge-neutralization charged particle beam source based on brightness of an image of the sample.

15. The charged particle beam device according to claim 8, wherein the control section determines whether or not to operate the first charge-neutralization charged particle beam source based on a temporal displacement of an image of the sample.

16. The charged particle beam device according to claim 8, further comprising an ion collector between the electrode unit and the sample,
    wherein the ion collector is disposed such that a center of the ion collector corresponds to an optical axis of the primary charged particle beam.

17. The charged particle beam device according to claim 8, wherein the plate electrode comprises a cylindrical multistage orifice on an incident side of the primary charged particle beam.

* * * * *